US012772470B2

(12) United States Patent
Kim et al.

(10) Patent No.: US 12,772,470 B2
(45) Date of Patent: Oct. 20, 2026

(54) CAPACITOR AND SEMICONDUCTOR DEVICE INCLUDING THE SAME

(71) Applicant: Samsung Electronics Co., Ltd., Suwon-si (KR)

(72) Inventors: Sunghyun Kim, Suwon-si (KR); Sungchan Kang, Suwon-si (KR); Haeryong Kim, Suwon-si (KR); Jeonggyu Song, Suwon-si (KR); Cheheung Kim, Suwon-si (KR); Jooho Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 434 days.

(21) Appl. No.: 18/363,045

(22) Filed: Aug. 1, 2023

(65) Prior Publication Data

US 2024/0213306 A1 Jun. 27, 2024

(30) Foreign Application Priority Data

Dec. 27, 2022 (KR) ........................ 10-2022-0186384

(51) Int. Cl.
*H10D 1/68* (2025.01)
*H01G 4/008* (2006.01)
(Continued)

(52) U.S. Cl.
CPC ............. *H10D 1/696* (2025.01); *H01G 4/008* (2013.01); *H01G 4/1209* (2013.01);
(Continued)

(58) Field of Classification Search
CPC .............. H10B 12/30–395; H10B 12/03–0387
See application file for complete search history.

(56) References Cited

U.S. PATENT DOCUMENTS 7,612,400 B2 11/2009 Kurahashi et al.
8,159,016 B2 4/2012 Park et al.
(Continued)

FOREIGN PATENT DOCUMENTS

KR 10-0321699 B1 3/2002
KR 10-0519777 B1 10/2005
(Continued)

OTHER PUBLICATIONS

N. Miura et al., "Thermal annealing effects on Ni/Au based Schottky contacts on n-GaN and AlGaN/GaN with insertion of high work function metal", Solid-State Electronics 48 (2004) 689-695, Sep. 24, 2003.
(Continued)

*Primary Examiner* — Christine S. Kim
*Assistant Examiner* — Cole Leon Lindsey
(74) *Attorney, Agent, or Firm* — Harness, Dickey & Pierce, P.L.C.

(57) ABSTRACT

Provided are a capacitor and a semiconductor device including the same. The capacitor includes a first electrode, a dielectric layer over the first electrode, a second electrode between the first electrode and the dielectric layer, and a third electrode over the dielectric layer and in contact with the dielectric layer such that the dielectric layer is between the second electrode and the third electrode. A thermal expansion coefficient of the first electrode may be greater than a thermal expansion coefficient of the dielectric layer, and a work function of the second electrode may be higher than a work function of the first electrode.

19 Claims, 8 Drawing Sheets

(51) Int. Cl.
*H01G 4/12* (2006.01)
*H01G 4/33* (2006.01)
*H10D 84/80* (2025.01)

(52) U.S. Cl.
CPC ......... *H01G 4/1218* (2013.01); *H01G 4/1236* (2013.01); *H01G 4/33* (2013.01); *H10D 84/811* (2025.01); *H10D 1/694* (2025.01)

(56) References Cited

U.S. PATENT DOCUMENTS

| | | | | |
|---|---|---|---|---|
| 2004/0106252 | A1* | 6/2004 | Jeong | H10B 12/033 257/E21.018 |
| 2006/0214205 | A1* | 9/2006 | Baniecki | H01G 4/33 257/295 |
| 2016/0380044 | A1* | 12/2016 | Lee | H10D 1/696 257/532 |
| 2018/0247941 | A1 | 8/2018 | Kim et al. | |
| 2020/0020780 | A1 | 1/2020 | Kim | |
| 2020/0058731 | A1 | 2/2020 | Mun et al. | |
| 2021/0142946 | A1* | 5/2021 | Kang | H01G 4/10 |
| 2021/0183993 | A1 | 6/2021 | Kim et al. | |
| 2022/0084935 | A1 | 3/2022 | Lin et al. | |

FOREIGN PATENT DOCUMENTS

| | | | |
|---|---|---|---|
| KR | 10-0683675 | B1 | 2/2007 |
| KR | 10-0944192 | B1 | 2/2010 |
| KR | 10-2018-0099197 | A | 9/2018 |
| KR | 10-2020-0007583 | A | 1/2020 |
| KR | 10-2020-0019553 | | 2/2020 |
| KR | 10-2021-0075727 | A | 6/2021 |
| KR | 10-2022-0036825 | A | 3/2022 |

OTHER PUBLICATIONS

Fu-Chien Chiu, “A Review on Conduction Mechanisms in Dielectric Films”, Advances in Materials Science and Engineering, 2014, 1-18, Feb. 18, 2014.

Lei Zhang et al., “Continuously Tuning Epitaxial Strains by Thermal Mismatch”, ; ACS Nano 2018, 12, 1306?1312, Jan. 10, 2018.

* cited by examiner

CAPACITOR AND SEMICONDUCTOR DEVICE INCLUDING THE SAME

CROSS-REFERENCE TO RELATED APPLICATIONS

This application is based on and claims priority under 35 U.S.C. § 119 to Korean Patent Application No. 10-2022-0186384, filed on Dec. 27, 2022, in the Korean Intellectual Property Office, the disclosure of which is incorporated by reference herein in its entirety.

BACKGROUND

1. Field

The disclosure relates to a capacitor and a semiconductor device including the same.

2. Description of the Related Art

With the down-scaling of integrated circuit devices, the available space to be occupied by a capacitor has been also reduced. Capacitors include upper and lower electrodes and a dielectric film therebetween, and a high-permittivity dielectric material is used to obtain high capacitance. However, as the thickness of the dielectric film decreases a leakage current may flow in the capacitor, thereby resulting in a reduction in capacitance and/or charge retention in the capacitor. Therefore, a technique for minimizing the capacitance reduction while reducing the leakage current flowing in the capacitor is required.

SUMMARY

Provided is a capacitor having high permittivity and superior leakage current blocking characteristics.

Provided is a semiconductor device including a capacitor having high permittivity and superior leakage current blocking characteristics.

However, the disclosure is not limited thereto.

Additional aspects will be set forth in part in the description which follows and, in part, will be apparent from the description, or may be learned by practice of the presented embodiments of the disclosure.

According to an aspect of the disclosure, a capacitor includes a first electrode, a dielectric layer over the first electrode, a second electrode between the first electrode and the dielectric layer, and a third electrode over the dielectric layer and in contact with the dielectric layer such that the dielectric layer is between the second electrode and the third electrode, in which a thermal expansion coefficient of the first electrode is greater than a thermal expansion coefficient of the dielectric layer, and a work function of the second electrode is higher than a work function of the first electrode.

The thermal expansion coefficient of the first electrode may be greater than or equal to $6.0\times10^{-6}$/K and less than or equal to $8.0\times10^{-6}$/K.

A work function of the second electrode may be greater than or equal to 4.0 eV and less than or equal to 7.0 eV.

A thickness of the second electrode may be less than or equal to 1/10 of a thickness of the first electrode.

A thickness of the first electrode may be greater than or equal to 10 nm.

A thickness of the second electrode may be less than or equal to 1 nm.

The dielectric layer may include an oxide of at least one of hafnium (Hf), zirconium (Zr), titanium (Ti), barium (Ba), or strontium (Sr).

The first electrode may include at least one of titanium (Ti), nickel (Ni), aluminum (Al), tantalum (Ta), molybdenum (Mo), vanadium (V), niobium (Nb), or magnesium (Mg).

The first electrode may include at least one of a metal, an oxide, or a nitride.

The second electrode may include at least one of tantalum (Ta), nickel (Ni), tungsten (W), platinum (Pt), palladium (Pd), gold (Au), iridium (Ir), or ruthenium (Ru).

The second electrode may include at least one of a metal, an oxide, or a nitride.

The dielectric layer may be tensile-strained in a thickness direction of the dielectric layer.

A magnitude of the tensile strain in the dielectric layer may be based on a difference between the thermal expansion coefficient of the first electrode and the thermal expansion coefficient of the dielectric layer.

A phase of the dielectric layer may be a tetragonal phase.

The first electrode may be rod-shaped, the second electrode may surround the first electrode, the dielectric layer may surround the second electrode, and the third electrode may surround the dielectric layer.

According to another aspect of the disclosure, a semiconductor device includes a transistor and a capacitor electrically connected to the transistor, in which the capacitor includes a first electrode, a dielectric layer on the first electrode, a second electrode between the first electrode and the dielectric layer, and a third electrode on the dielectric layer and in contact with the dielectric layer such that the dielectric layer is between the second electrode and the third electrode, in which a thermal expansion coefficient of the first electrode is greater than a thermal expansion coefficient of the dielectric layer, and a work function of the second electrode is higher than a work function of the first electrode.

The thermal expansion coefficient of the first electrode may be greater than or equal to $6.0\times10^{-6}$/K and less than or equal to $8.0\times10^{-6}$/K.

A work function of the second electrode may be greater than or equal to 4.0 eV and less than or equal to 7.0 eV.

A thickness of the second electrode may be less than or equal to about 1/10 of a thickness of the first electrode.

A magnitude of a tensile strain in the dielectric layer may be based on a difference between the thermal expansion coefficient of the first electrode and the thermal expansion coefficient of the dielectric layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
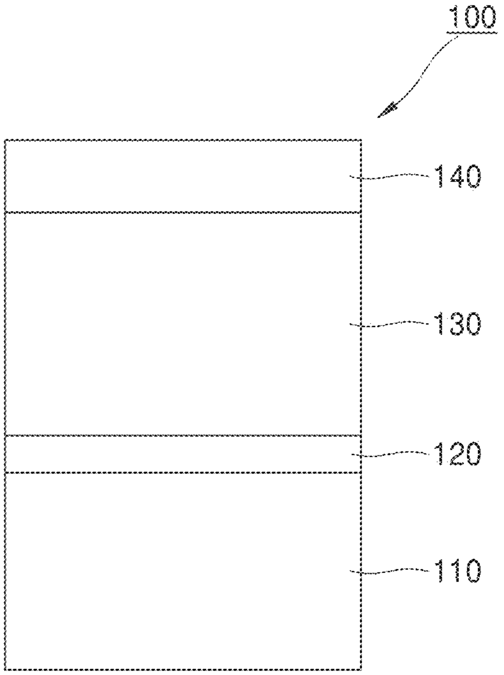
FIG. 1 is a cross-sectional view of a capacitor according to at least one example embodiment.

Reference will now be made in detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, various embodiments disclosed herein will be described in detail with reference to the accompanying drawings. In the drawings, like reference numerals denote like components, and sizes of components in the drawings may be exaggerated for convenience of explanation. Meanwhile, embodiments to be described are merely examples, and various modifications may be made from such embodiments.

When an expression "above" or "on" may include not only "directly on/under/at left/right contact", as well as "on/under/at left/right contactless" unless expressly indicated otherwise. For example, it will be understood that such spatially relative terms are intended to encompass different orientations of the device in use or operation in addition to the orientation depicted in the figures, and that the device may be otherwise oriented (rotated 90 degrees or at other orientations) and the spatially relative terms used herein interpreted accordingly. Singular forms include plural forms unless apparently indicated otherwise contextually. When a portion is referred to as "comprises" a component, the portion may not exclude another component but may further include another component unless stated otherwise. When the terms "about" or "substantially" are used in this specification in connection with a numerical value, it is intended that the associated numerical value includes a manufacturing tolerance (e.g., ±10%) around the stated numerical value. Further, regardless of whether numerical values are modified as "about" or "substantially," it will be understood that these values should be construed as including a manufacturing or operational tolerance (e.g., ±10%) around the stated numerical values.

The use of the terms of "the above-described" and similar indicative terms may correspond to both the singular forms and the plural forms. When there is an explicit description of the order of operations of the method or there is no description contrary thereto, these operations may be performed in an appropriate order and the order is not necessarily limited to the described order.

The functional elements described herein using terms such as "unit" indicate a unit for processing at least one function or operation, and may be implemented in processing circuitry such as hardware, software, and/or a combination of hardware and software. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc., and/or electronic circuits including said components. For example, the processing circuitry may include electrical components such as logic gates including at least one of AND gates, OR gates, NAND gates, NOT gates, etc., and/or electronic circuits including said components.

Terms such as "first", "second", and the like may be used to describe various elements, but the elements should not be limited to those terms. These terms may be used to distinguish one element from another element.

Connections of lines or connection members between components shown in the drawings are illustrative of functional connections and/or physical or circuit connections, and in practice, may be represented as alternative or additional various functional connections, physical connections, or circuit connections.

The use of all examples or exemplary terms is only to describe technical spirit in detail, and the scope is not limited by these examples or terms unless limited by the claims.

FIG. 1 is a cross-sectional view of a capacitor according to at least one example embodiment.

Referring to FIG. 1, a capacitor 100 includes a first electrode 110, a dielectric layer 130 arranged on the first electrode 110, a second electrode 120 arranged between the first electrode 110 and the dielectric layer 130, and a third electrode 140 that contacts the dielectric layer 130 and is arranged on the dielectric layer 130.

A material of the first electrode 110 may be selected to guarantee conductivity as an electrode and to maintain stable capacitance performance even after a high-temperature process in a process of manufacturing the capacitor 100. For example, the material of the first electrode 110 may be, or include, a metallically conductive material selected based on the lattice parameters, the stability of the material, the interaction of the material with other contacting materials, and/or the like.

The first electrode 110 may include metal, a conductive metal nitride, a conductive metal oxide, and/or a combination thereof. For example, the first electrode 110 may include Ti, Ni, Al, Ta, Mo, V, Mg, Nb, TiN, MoN, CoN, TaN, W, Ru, $RuO_2$, $SrRuO_3$, Ir, $IrO_2$, Pt, PtO, and/or a combination thereof.

The second electrode 120 may be arranged between the first electrode 110 and the dielectric layer 130. The second electrode 120 may be provided on the first electrode 110. The second electrode 120 may directly contact the first electrode 110. The second electrode 120 may have a material selected based on a desired capacitance. For example, the material may be selected based on the permittivity of the material and the thickness of the capacitor 100 to implement a capacitor with the desired capacitance. As the degree of integration of an integrated circuit device included in the capacitor 100 increases, a space occupied by the capacitor 100 gradually decreases and thus a high-permittivity dielectric may be required. The second electrode 120 may use a metal oxide including at least one metal selected from among Ca, Sr, Ba, Sc, Y, La, Ti, Hf, Zr, Nb, Ta, Ce, Pr, Nd, Gd, Dy, Yb, and/or Lu. For example, the second electrode 120 may include $HfO_2$, $ZrO_2$, $CeO_2$, $La_2O_3$, $Ta_2O_3$, or $TiO_2$. However, the disclosure is not limited thereto.

A thickness of the first electrode 110 may be greater than that of the second electrode 120. In at least one embodiment, a ratio of the thickness of the first electrode 110 and the second electrode 120 is set such that the second electrode 120 does not prevent the formation of strain in the dielectric due to a difference in thermal expansion coefficients between the first electrode 110 and the dielectric layer 130, as described below in further detail. For example, in at least one embodiment, the thickness of the second electrode 120 may be less than or equal to about 1/10 of that of the first electrode 110.

For example, in at least one embodiment, the thickness of the first electrode 110 may be greater than or equal to 10 nm, and the thickness of the second electrode 120 may be less than or equal to about 1 nm.

The dielectric layer 130 included in the capacitor 100 needs to minimize a leakage current resulting from high integration.

In this regard, by inserting a high work function material between a dielectric layer (e.g., the dielectric layer 130) and an electrode including a conductive material such as metal (e.g., the first electrode 11), a leakage current may be minimized.

For example, a work function of the second electrode 120 may be higher than that of the first electrode 110. For example, the work function of the second electrode 120 may be about 4.0 eV or higher and about 7.0 eV or lower. For example, without being necessarily limited thereto, in at least one example, the work function of the second electrode 120 may be about 4.5 eV.

The leakage current of the capacitor 100 may be reduced or minimized due to the high work function of the second electrode 120. Work function characteristics of the second electrode 120 may be classified as electrical characteristics that may be manifested in case of relatively thin thicknesses, unlike mechanical characteristics.

The dielectric layer 130 may be arranged above the first electrode 110 and the second electrode 120.

The dielectric layer 130 may include at least one of a hafnium oxide, a zirconium oxide, a titanium oxide, a barium oxide, and/or a strontium oxide. In at least one embodiment, the dielectric layer 130 includes a different material than the second electrode 120. The materials of the dielectric layer 130 and the second electrode 120 may be selected based on the thermal expansion coefficients and work functions of the materials, as described in further detail below.

For meet the demands for applications in an electronic device or a semiconductor device (e.g., as a component of dynamic random-access memory (DRAM)) with high integration requirements, a dielectric layer of a capacitor must have both high permittivity and low leakage current characteristics even in cases with thin thicknesses (less than about 15 nm). However, the disclosure is not limited thereto.

The third electrode 140 may be arranged on the dielectric layer 130.

The third electrode 140 may include metal, a conductive metal nitride, a conductive metal oxide, and/or a combination thereof, like the first electrode 110. In at least one embodiment, the third electrode 140 may comprise one or more material layers.

For example, the third electrode 140 may use a metal oxide including at least one metal selected from among Ca, Sr, Ba, Sc, Y, La, Ti, Hf, Zr, Nb, Ta, Ce, Pr, Nd, Gd, Dy, Yb, and/or Lu. However, the disclosure is not limited thereto.

In at least one example embodiment, the third electrode 140 may include $HfO_2$, $ZrO_2$, $CeO_2$, $La_2O_3$, $Ta_2O_3$, and/or $TiO_2$. For example, the third electrode 140 may include at least one layer of $HfO_2$, $ZrO_2$, $CeO_2$, $La_2O_3$, $Ta_2O_3$, or $TiO_2$. However, the disclosure is not limited thereto.

Figure 2:
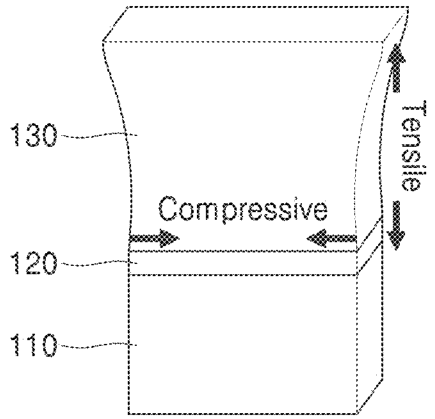
FIG. 2 is a view for describing strain with respect to a difference in thermal expansion coefficient between an electrode and a dielectric layer.

FIG. 2 is a view for describing strain with respect to a difference in thermal expansion coefficient between an electrode and a dielectric layer.

Referring to FIG. 2, different strains may occur due to a difference in thermal expansion coefficient between an electrode (e.g., the first electrode 110) and a dielectric layer (e.g., the dielectric layer 130) that have been heated to a high temperature in a process of manufacturing the capacitor 100.

The thermal expansion coefficient may refer to a result of calculating a change in length and/or volume as result in a change in the temperature of a material by 1° C. with respect to a length (or volume) at a temperature of 0° C. of the material. A material having a higher thermal expansion coefficient may experience more changes in physical length or volume for a change in unit temperature.

For example, when a material with a relatively high thermal expansion coefficient adjoins a material with a relatively low thermal expansion coefficient, strain may occur between the materials during a temperature change from a high-temperature state to a low-temperature state, because of the different degrees of thermal expansion between the materials.

More specifically, because a material with a high thermal expansion coefficient contracts much faster than a material with a relatively low thermal expansion coefficient an in-plane strain (e.g., compressive strain) may occur in the material with the high thermal expansion coefficient and out-of-plane strain (e.g., tensile strain) may occur in perpendicular to a contact surface in the material with the low thermal expansion coefficient while the materials cool from the high-temperature state. For example, in at least one embodiment, the temperature of the first electrode 110 may be increased to a high-temperature during the deposition of the dielectric layer 130 onto the second electrode 120. Then, during a cooling process, strain is created due to the difference in thermal expansion coefficients. In at least one embodiment, the strain is maintained even during temperature fluctuations occurring during the normal operation of the capacitor 100.

In at least one embodiment, the rate of cooling is controlled to prevent delamination and/or to control the rate of change in and magnitude of the in-plane and/or out-of-plane stress. In at least one embodiment, the second electrode 120 may serve as an intermediary or buffer layer, such that the second electrode 120 mitigates and/or prevents delamination during the heating and cooling periods. In at least one embodiment, the second electrode 120 serves as a buffer to mitigate or prevent the occurrence of the in-plane and out-of-plain strain from temperature fluctuations occurring during the normal operation of the capacitor 100. Further, as described above, in at least one embodiment, the second electrode 120 increases the work function for leakage current in the capacitor 100.

As such, in at least one embodiment, a phase change in the material of the dielectric layer 130 is induced due to the stress resulting from the thermal expansion coefficient of the first electrode 110 being higher than that of the dielectric layer 130. In at least one embodiment, the stress may help stabilize the phase of the dielectric layer 130.

In at least one embodiment, the thermal expansion coefficient of the first electrode 110 may be greater than or equal to $6.0\times10^{-6}$/K and/or less than or equal to about $8.0\times10^{-6}$/K. For example, in at least one example embodiment, the thermal expansion coefficient of the first electrode 110 may be greater than or equal to $7.3\times10^{-6}$/K, without being limited thereto.

The thermal expansion coefficient of the dielectric layer 130 may be less than or equal to about $6.0\times10^{-6}$/K, without being limited thereto.

As the thermal expansion coefficient of the first electrode 110 is higher than that of the dielectric layer 130, a physical change of the first electrode 110 may be even higher than that of the dielectric layer 130 during a temperature change from a high temperature back to a low temperature in the process of manufacturing the capacitor 100 as described above. Thus, in-plane strain in a direction parallel to the contact surface between the first electrode 110 and the dielectric layer 130 may occur, and out-of-strain in a direction perpendicular to the contact surface may occur. That is, strain in a certain direction may occur due to mismatch in thermal expansion coefficient between materials included in different layers.

The hafnium oxide, the zirconium oxide, the titanium oxide, the barium oxide, and the strontium oxide included in the dielectric layer 130 may react to strain change in terms of permittivity (dielectric constant).

For example, in the hafnium oxide and/or the zirconium oxide of the dielectric layer 130, as the out-of-plane strain (or tensile strain) in the direction perpendicular to the contact surface between the first electrode 110 and the dielectric layer 130 increases, lattice strain occurs, which increases the permittivity (dielectric constant) of the dielectric layer 130.

The tensile strain applied to the dielectric layer 130 may be determined according to a difference in thermal expansion coefficient between the first electrode 110 and the dielectric layer 130, and the tensile strain may be applied in a thickness direction of the first electrode 110.

Mismatch in thermal expansion coefficient may occur according to a difference in thermal expansion coefficient between materials included in different layers, and lattice strain may occur due to certain strain occurring with the mismatch, and the permittivity of the dielectric layer 130 included in the capacitor 100 may change with the lattice strain.

The thermal expansion coefficient characteristics of the first electrode 110 may be mechanical characteristics, and may be expressed strongly in the thickness direction of the capacitor, unlike the electrical characteristics. In spite of thick thickness or presence of an additional insertion film in the thickness direction, the mechanical characteristics may be expressed. Thus, in case of insertion of the second electrode 120 between the first electrode 110 and the dielectric layer 130 as well as direct contact between the first electrode 110 and the dielectric layer 130, strain and mechanical characteristic expression may occur due to a difference in thermal expansion coefficient between the first electrode 110 and the dielectric layer 130.

Figure 3:
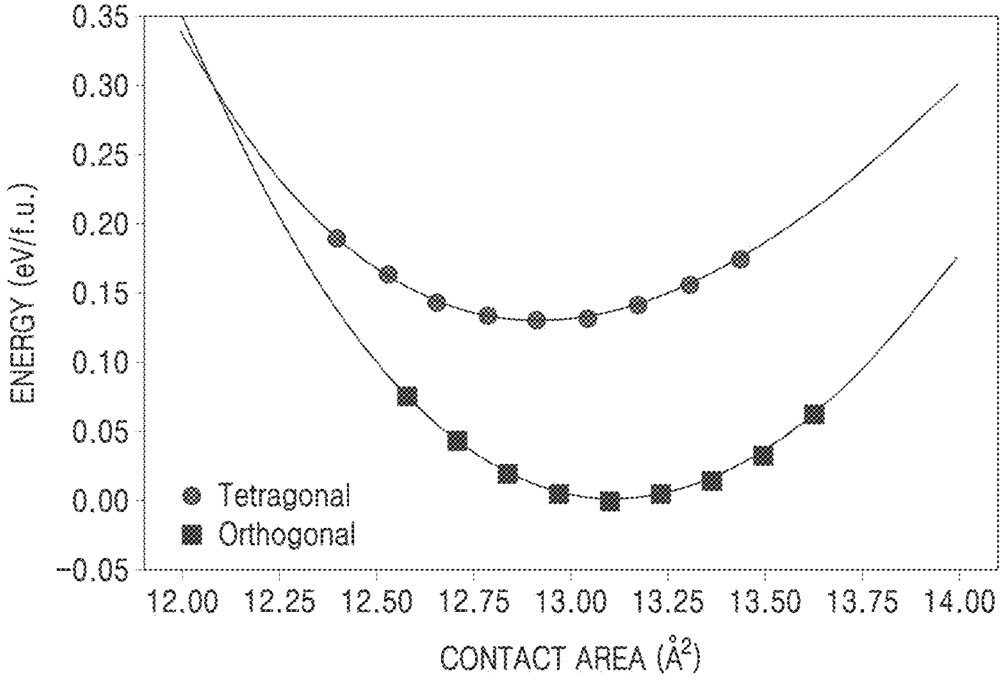
FIG. 3 is a view for describing an energy change of a dielectric layer according to at least one example embodiment.

FIG. 3 is a view for describing an energy change of a dielectric layer according to at least one example embodiment.

Referring to FIG. 3, an energy change is shown which may occur when in-plane strain in a direction parallel to a contact surface between the dielectric layer 130 and the first electrode 110 is applied to the hafnium oxide included in the dielectric layer 130.

The hafnium oxide included in the dielectric layer 130 may include, for example, $HfO_2$, which may have a tetragonal and/or orthogonal system according to a certain condition. In at least one embodiment, the rate of cooling may be controlled such that the dielectric layer includes $HfO_2$ primarily of the tetragonal phase. $HfO_2$ having the tetragonal system may have a higher permittivity (dielectric constant) and a more unstable phase than those of $HfO_2$ having the orthogonal system.

As the in-plane strain in the direction parallel to the contact surface between the dielectric layer 130 and the first electrode 110 is applied, an area of the contact surface may be reduced, which leads to reduction in an energy difference between the tetragonal system and the orthogonal system, thereby stabilizing the more unstable tetragonal phase.

As the dielectric layer with the high permittivity is required with high integration of the capacitor, $HfO_2$ having the tetragonal system with a relatively high permittivity (dielectric constant) may be stabilized in terms of energy and an energy difference between two phases may almost disappear with further reduction in the area of the contact surface.

Figure 4:
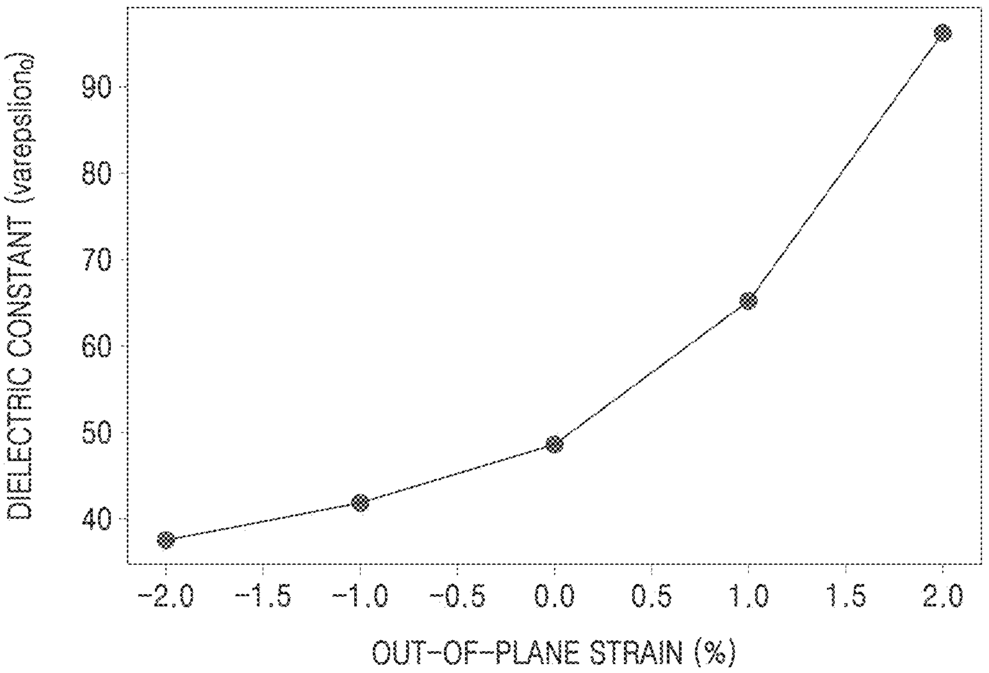
FIG. 4 is a view for describing a permittivity change of a dielectric layer according to at least one example embodiment.

FIG. 4 is a view for describing a permittivity change of a dielectric layer according to at least one example embodiment.

Referring to FIG. 4, a change in permittivity (dielectric constant) with respect to a change in out-of-plane strain applied to the dielectric layer 130 in the direction perpendicular to the contact surface is shown.

The aforementioned in-plane strain in the direction parallel to the contact surface may generate the out-of-plane strain in the direction perpendicular to the contact surface according to the Poisson's ratio.

In the zirconium oxide included in the dielectric layer 130, a permittivity (dielectric constant (represented by $varepsilon_o$ or $\varepsilon_o$)) increases as the out-of-plane strain increases. Thus, the in-plane strain may contribute to improvement of the permittivity (dielectric constant) of the dielectric layer 130 as well as to energy stabilization of the aforementioned tetragonal system.

Figure 5:
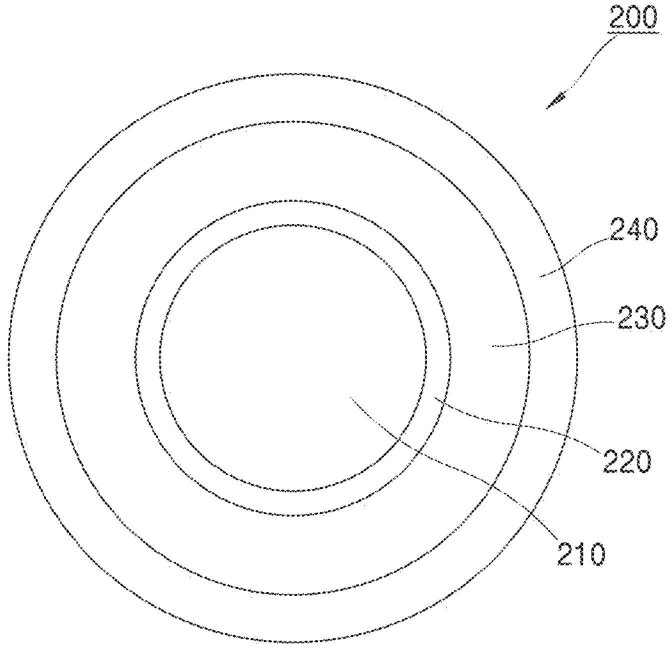
FIG. 5 is a cross-sectional view of a capacitor according to at least one example embodiment.

FIG. 5 is a cross-sectional view of the capacitor 100 according to at least one example embodiment.

The capacitor 100 of FIG. 5 may include a three-dimensional (3D) cylinder structure rather than a flat plate structure illustrated in FIG. 1. The materials of the first electrode 210, the second electrode 220, the dielectric layer 230, and the third electrode 240 may be the same, or substantially similar to the materials of the first electrode 110, the second electrode 120, the dielectric layer 130, and the third electrode 140 described above; as such the repeat descriptions thereof are omitted.

Referring to FIG. 5, the first electrode 210 is rod-shaped, the second electrode 220 surrounds the circumference of the first electrode 210, the dielectric layer 230 surrounds the circumference of the second electrode 220, and the third electrode 240 surrounding a side of the dielectric layer 230 may be included.

Figure 6:
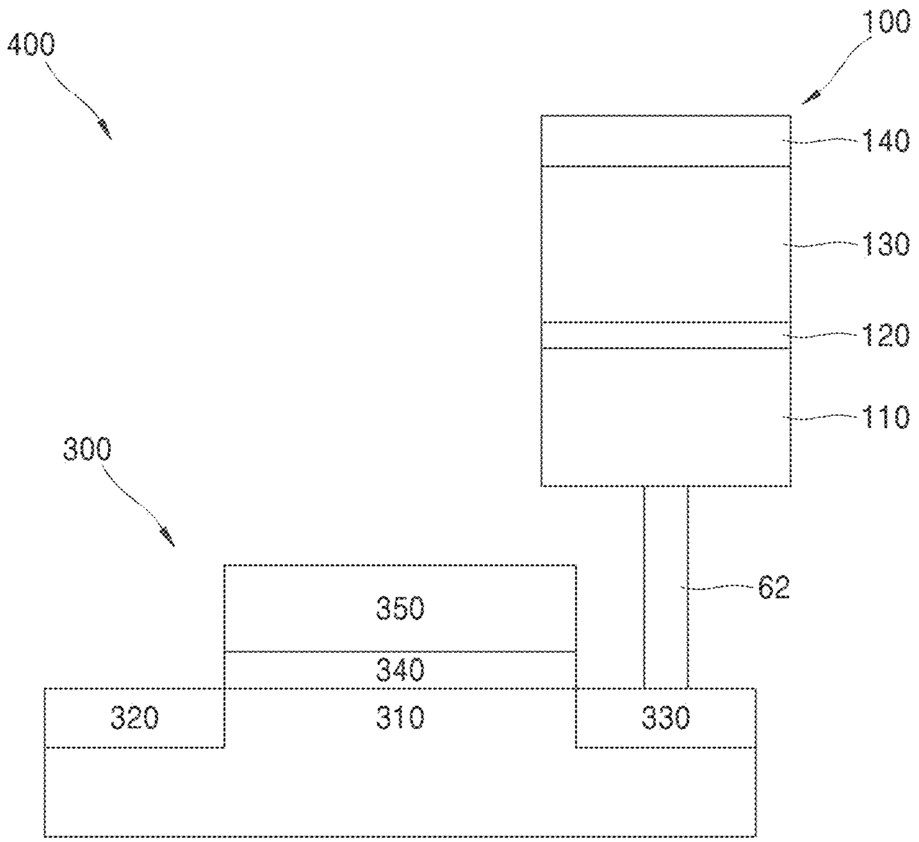
FIG. 6 is a schematic diagram of a semiconductor device (a connection structure between a capacitor and a transistor) according to at least one example embodiment.

FIG. 6 is a schematic diagram of a semiconductor device (a connection structure between a capacitor and a transistor) according to at least one example embodiment.

Referring to FIG. 6, a semiconductor device 400 may have a structure where the capacitor 100 including the first electrode 110, the second electrode 120, and the dielectric layer 130 and a transistor 300 are electrically connected to each other by a contact 62. However, the description is not limited thereto. For example, in at least one embodiment, the contact may be omitted and the transistor 300 and the capacitor 100 may be in direct contact. In at least one example embodiment, the capacitor may be the capacitor 200. The transistor 300 may include a field-effect transistor, without being necessarily limited thereto.

For example, one of electrodes of the capacitor 100 and one of a source 320 or a drain 330 of the transistor 300 may be electrically connected to each other by the contact 62. The contact 62 may include an appropriate conductive material, e.g., tungsten, copper, aluminum, polysilicon, etc.

The transistor 300 may include a substrate including the source 320, the drain 330, and a channel 310, and a gate electrode 350 opposing the channel 310. A gate insulating layer 340 may be further included between the substrate and the gate electrode 350.

The source 320 and the drain 330 may be formed of a conductive material, and each of which may independently include, for example, metal, a metal compound, or a conductive polymer. In at least one example embodiment, channel 310, the source 320, and/or the drain 330 may be formed by doping the substrate.

The source 320, the drain 330, the channel 310, the substrate, and the gate electrode 350 may be the same as those of a typical field-effect transistor.

Arrangement of the capacitor 100 and the transistor 300 may be changed variously. For example, the capacitor 100 may be arranged on the substrate or may be buried in the substrate.

A semiconductor element and a semiconductor device may be applied to various electronic devices. For example, the field-effect transistor, the capacitor, or the combination thereof described above may be applied as a logic element and/or a memory element in various electronic devices. A semiconductor element according to embodiments may be useful in terms of efficiency, speed, and power consumption, thus responding to demands for miniaturization and integration of electronic devices. More specifically, the semiconductor element and the semiconductor device may be used for arithmetic operations, program execution, temporary data retaining, etc., in an electronic device such as a mobile device, a computer, a laptop computer, a sensor, a network device, a neuromorphic device, etc. The semiconductor element and the semiconductor device according to embodiments may be useful for electronic devices with large data transmission volume and continuous data transmission.

Figure 7:
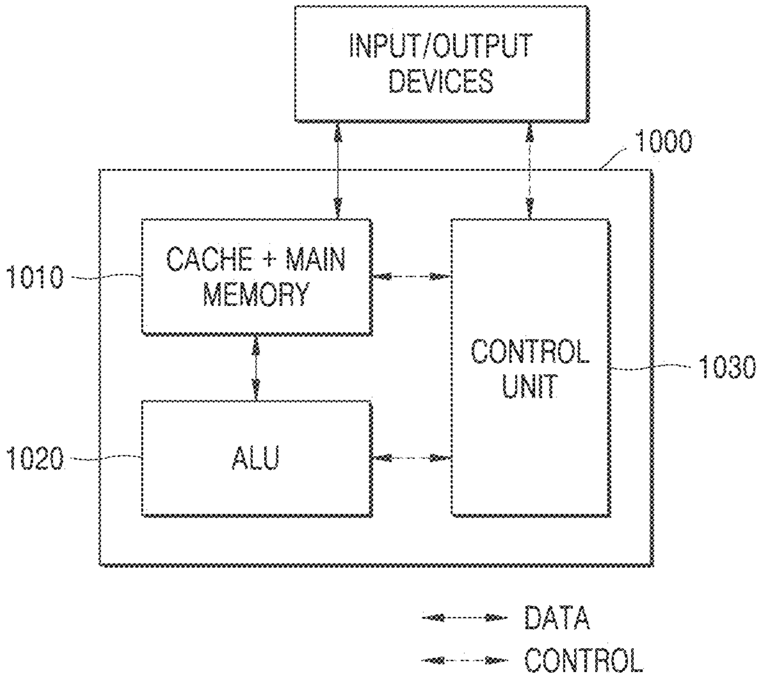
FIGS. 7 and 8 are conceptual views schematically showing a device architecture applicable to an electronic device according to at least one example embodiment.
Figure 8:
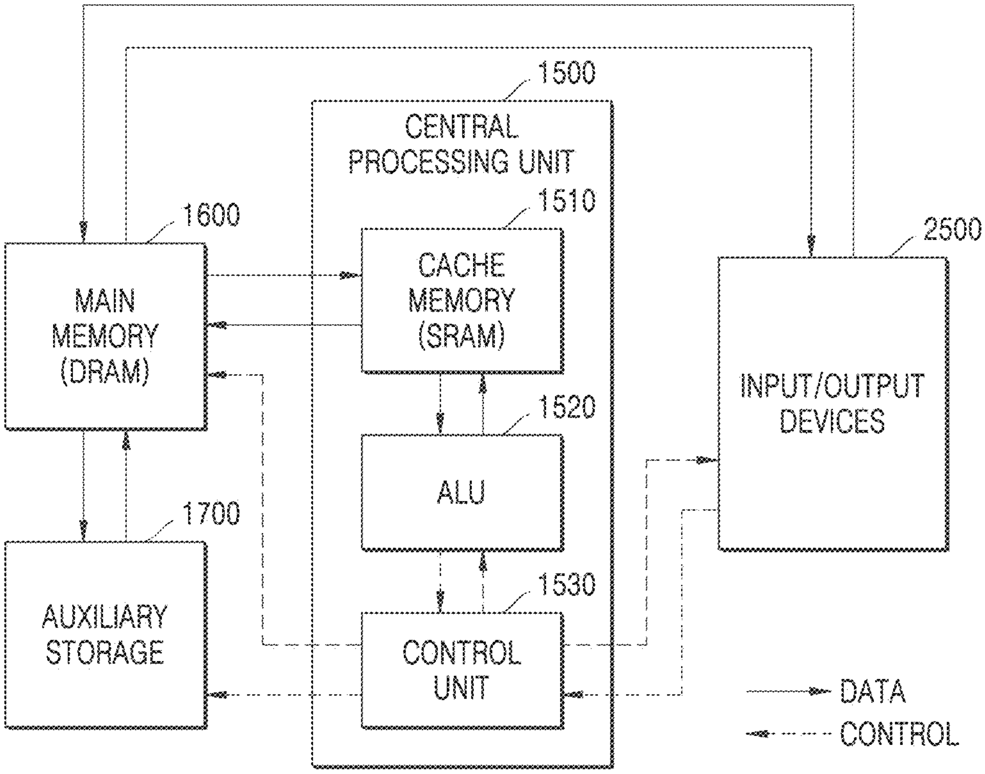

FIGS. 7 and 8 are conceptual views schematically showing an electronic device architecture applicable to an electronic device according to at least one embodiment.

Referring to FIG. 7, an electronic device architecture 1000 may include a memory unit 1010, an arithmetic logic unit (ALU) 1020, and a control unit 1030. The memory unit 1010, the ALU 1020, and the control unit 1030 may be electrically connected to one another. For example, the electronic device architecture 1000 may be implemented as one chip including the memory unit 1010, the ALU 1020, and the control unit 1030. More specifically, the memory unit 1010, the ALU 1020, and the control unit 1030 may communicate directly by being connected to one another through a metal line on-chip. In at least one embodiment, the memory unit 1010, the ALU 1020, and the control unit 1030 may be monolithically integrated on one substrate to form one chip. An input/output device 2000 may be connected to the electronic device architecture (chip) 1000.

Each of the memory unit 1010, the ALU 1020, and the control unit 1030 may independently include the above-described semiconductor device (a field-effect transistor, a capacitor, etc.). For example, each of the ALU 1020 and the control unit 1030 may independently include the above-described field-effect transistor, and the memory unit 1010 may include the above-described capacitor, field-effect transistor, or a combination thereof. The memory unit 1010 may include both a main memory and a cache memory. The electronic device architecture (chip) 1000 may be an on-chip memory processing unit.

Referring to FIG. 8, a cache memory 1510, an ALU 1520, and a control unit 1530 may constitute a central processing unit (CPU) 1500. The cache memory 1510 may include static random access memory (SRAM) and may include the above-described field-effect transistor. The cache memory 1510 may include a main memory 1600 and an auxiliary storage 1700 in addition to the CPU 1500. The main memory 1600 may include dynamic random access memory (DRAM) and may include the above-described capacitor.

Depending on a circumstance, the electronic device architecture may be implemented in a form where computing-unit devices and memory-unit devices are adjacent to each other in one chip, without distinction of sub-units.

The capacitor according to at least one embodiment may minimize the leakage current thereof by the electrode having a high work function. The capacitor according to at least one embodiment may improve a permittivity (dielectric constant) of the dielectric layer through lattice strain caused by strain occurring due to a difference in thermal expansion coefficient between the electrode and the dielectric layer. However, effects of the disclosure are not limited to the above disclosure.

While the above-described capacitor, semiconductor device, and the electronic device including the same have been described with reference to the embodiments described in the drawings, it will be understood by those of ordinary skill in the art that various modifications and equivalent other embodiments are possible therefrom. Therefore, the disclosed embodiments should be considered in a descriptive sense rather than a restrictive sense. The scope of the present specification is not described above, but in the claims, and all the differences in a range equivalent thereto should be interpreted as being included.

Although the embodiments have been described above, these are merely examples and various changes may be made therefrom by those of ordinary skill in the art.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A capacitor comprising:

a first electrode;

a dielectric layer spaced apart from the first electrode such that a first surface of the dielectric layer faces a first surface of the first electrode;

a second electrode between the first electrode and the dielectric layer such that a first surface of the second electrode faces the first surface of the dielectric layer and a second surface of the second electrode faces the first surface of the first electrode, the second surface of the second electrode opposite to the first surface of the second electrode; and a third electrode over the dielectric layer and in contact with the dielectric layer such that the dielectric layer is between the second electrode and the third electrode, wherein a thermal expansion coefficient of the first electrode is greater than a thermal expansion coefficient of the dielectric layer, the first electrode inducing a strain in the dielectric layer such that the dielectric layer is tensile-strained in a thickness direction of the dielectric layer, and a work function of the second electrode is higher than a work function of the first electrode.

2. The capacitor of claim 1, wherein the thermal expansion coefficient of the first electrode is greater than or equal to $6.0\times10^{-6}$/K and less than or equal to $8.0\times10^{-6}$/K.

3. The capacitor of claim 1, wherein the work function of the second electrode is greater than or equal to 4.0 eV and less than or equal to 7.0 eV.

4. The capacitor of claim 1, wherein a thickness of the second electrode is less than or equal to a tenth (1/10) of a thickness of the first electrode.

5. The capacitor of claim 1, wherein a thickness of the first electrode is greater than or equal to 10 nm.

6. The capacitor of claim 1, wherein a thickness of the second electrode is less than or equal to 1 nm.

7. The capacitor of claim 1, wherein the dielectric layer comprises an oxide of at least one of hafnium (Hf), zirconium (Zr), titanium (Ti), barium (Ba), or strontium (Sr).

8. The capacitor of claim 1, wherein the first electrode comprises at least one of titanium (Ti), nickel (Ni), aluminum (Al), tantalum (Ta), molybdenum (Mo), vanadium (V), niobium (Nb), or magnesium (Mg).

9. The capacitor of claim 8, wherein the first electrode comprises at least one of a metal, an oxide, or a nitride.

10. The capacitor of claim 1, wherein the second electrode comprises at least one of tantalum (Ta), nickel (Ni), tungsten (W), platinum (Pt), palladium (Pd), gold (Au), iridium (Ir), or ruthenium (Ru).

11. The capacitor of claim 10, wherein the second electrode comprises at least one of a metal, an oxide, or a nitride.

12. The capacitor of claim 1, wherein a magnitude of a tensile strain in the dielectric layer is based on a difference between the thermal expansion coefficient of the first electrode and the thermal expansion coefficient of the dielectric layer.

13. The capacitor of claim 12, wherein a phase of the dielectric layer is a tetragonal phase.

14. The capacitor of claim 1, wherein the first electrode is rod-shaped, the second electrode surrounds the first electrode, the dielectric layer surrounds the second electrode, and the third electrode surrounds the dielectric layer.

15. A semiconductor device comprising:

a transistor; and a capacitor electrically connected to the transistor, wherein the capacitor comprises:

a first electrode, a dielectric layer spaced apart from the first electrode such that a first surface of the dielectric layer faces a first surface of the first electrode, a second electrode between the first electrode and the dielectric layer such that a first surface of the second electrode faces the first surface of the dielectric layer and a second surface of the second electrode faces the first surface of the first electrode, the second surface of the second electrode opposite to the first surface of the second electrode, and a third electrode on the dielectric layer and in contact with the dielectric layer such that the dielectric layer is between the second electrode and the third electrode, wherein a thermal expansion coefficient of the first electrode is greater than a thermal expansion coefficient of the dielectric layer, the first electrode inducing a strain in the dielectric layer such that the dielectric layer is tensile-strained in a thickness direction of the dielectric layer, and a work function of the second electrode is higher than a work function of the first electrode.

16. The semiconductor device of claim 15, wherein the thermal expansion coefficient of the first electrode is greater than or equal to $6.0\times10^{-6}$/K and less than or equal to $8.0\times10^{-6}$/K.

17. The semiconductor device of claim 15, wherein the work function of the second electrode is greater than or equal to 4.0 eV and less than or equal to 7.0 eV.

18. The semiconductor device of claim 15, wherein a thickness of the second electrode is less than or equal to a tenth (1/10) of a thickness of the first electrode.

19. The semiconductor device of claim 15, wherein a magnitude of the tensile strain in the dielectric layer is based on a difference between the thermal expansion coefficient of the first electrode and the thermal expansion coefficient of the dielectric layer.

* * * * *